(12) United States Patent
Guinea et al.

(10) Patent No.: US 6,414,526 B1
(45) Date of Patent: Jul. 2, 2002

(54) DELAY-LOCKED LOOP CIRCUIT

(75) Inventors: Jesus Guinea, Bergamo; Luciano Tomasini; Santo Maggio, both of Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/690,214

(22) Filed: Oct. 17, 2000

(30) Foreign Application Priority Data

Oct. 18, 1999 (EP) .............................................. 99830657

(51) Int. Cl.$^7$ ................................................. H03L 7/00
(52) U.S. Cl. ....................... 327/153; 327/149; 327/158; 327/161; 327/276
(58) Field of Search ................................ 327/151, 150, 327/152–156, 158, 159, 161–163, 146, 147, 149, 165, 166, 236, 237, 270, 271, 276–278, 284, 285, 291–294, 299

(56) References Cited

U.S. PATENT DOCUMENTS

| | | | | |
|---|---|---|---|---|
| 4,677,648 A | | 6/1987 | Zurfluh ........................ 375/120 |
| 4,847,870 A | * | 7/1989 | Butcher ....................... 375/333 |
| 5,087,829 A | * | 2/1992 | Ishibashi et al. ............. 327/152 |
| 5,488,641 A | * | 1/1996 | Ozkan ........................ 375/374 |
| 5,530,387 A | * | 6/1996 | Kim ............................ 327/119 |
| 5,537,069 A | * | 7/1996 | Vlok .......................... 327/149 |
| 5,548,235 A | * | 8/1996 | Marbot ....................... 327/158 |
| 5,663,665 A | | 9/1997 | Wang et al. .................... 373/3 |
| 5,764,092 A | | 6/1998 | Wada et al. .................. 327/271 |
| 5,786,715 A | * | 7/1998 | Halepete ..................... 327/116 |
| 5,838,178 A | * | 11/1998 | Marbot ....................... 327/116 |
| 6,037,812 A | * | 3/2000 | Gaudet ....................... 327/116 |
| 6,255,880 B1 | * | 7/2001 | Nguyen ...................... 327/277 |

FOREIGN PATENT DOCUMENTS

EP 0460274 12/1991 ........... H03L/7/081

* cited by examiner

Primary Examiner—Terry D. Cunningham
Assistant Examiner—Hai L. Nguyen
(74) Attorney, Agent, or Firm—Lisa K. Jorgenson; Allen, Dyer, Doppelt, Milbrath & Gilchrist, P.A.

(57) ABSTRACT

A delay-locked loop circuit (DLL) includes a delay line with a delay which can be varied in a controlled manner to delay a periodic input signal having a period T, and a control circuit for controlling the delay line to lock the delay to the period T. The delay line supplies to the control circuit a plurality of periodic signals each delayed relative to the periodic input signal by a respective fraction of the delay. The control circuit includes a sequence-detector circuit which can periodically detect in the delayed signals characteristic sequences of digital values indicative of the delay. The control circuit can bring about a reduction or an increase in the delay for locking to the period T based upon the detected types of characteristic sequences.

26 Claims, 5 Drawing Sheets

DELAY-LOCKED LOOP CIRCUIT

FIELD OF THE INVENTION

The present invention relates to electronics, and, more particularly a delay-locked loop circuit (DLL).

BACKGROUND OF THE INVENTION

A delay-locked loop (DLL) is a circuit with feedback which, on the basis of a periodic input signal of period T, can output a periodic signal with the same period T and with a delay $\Delta t$ relative to the input signal equal to and locked to the period T of the input signal.

Known DLLs include a delay line wherein the delay can be varied in a controlled manner. The delay line receives the periodic signal of period T as an input and produces the periodic signal delayed by $\Delta t$ as an output. The periodic input signal and the delayed periodic signal are supplied to a phase comparator circuit. On the basis of the phase difference detected between the delayed periodic signal and the periodic input signal, the phase comparator controls delay-line control logic circuitry which acts on the delay line to bring about an increase or a decrease in the delay $\Delta t$ to keep the delay equal to the period T.

The delay line is normally formed by a plurality of N elemental delay units which are normally identical to one another, at least theoretically, and each of which can introduce an elemental delay equal to $\Delta t/N$. In the locked condition, i.e., $\Delta t=T$, the DLL can thus supply, on the basis of the periodic input signal, N periodic signals all of equal period and each delayed relative to the preceding signal by a time $T/N$.

DLL circuits have various applications. In particular, these circuits may be used in the synchronous digital communications field, in which it is essential to have synchronization circuits to correctly decode data travelling on the communication channels. Reference is directed to European patent application No. 99830518.9 filed Aug. 6, 1999, the entirety of which is incorporated herein by reference and is assigned to the assignee of the present invention. A DLL is disclosed in the European patent application in which a synchronous digital hierarchy (SDH) communication interface, as an alternative to the usual phase-locked loop (PLL) circuits, is used for synchronization with a received data flow.

However, a disadvantage of known DLLs is that the locked condition may not occur, as would be desirable, with a delay $\Delta t=T$, but may occur instead with delays which are multiples or submultiples of the period T of the input signal. This is due basically to the fact that conventional phase comparators used in known DLLs cannot detect the phase difference correctly outside the range $+/-\pi$ rad.

Figure 1:
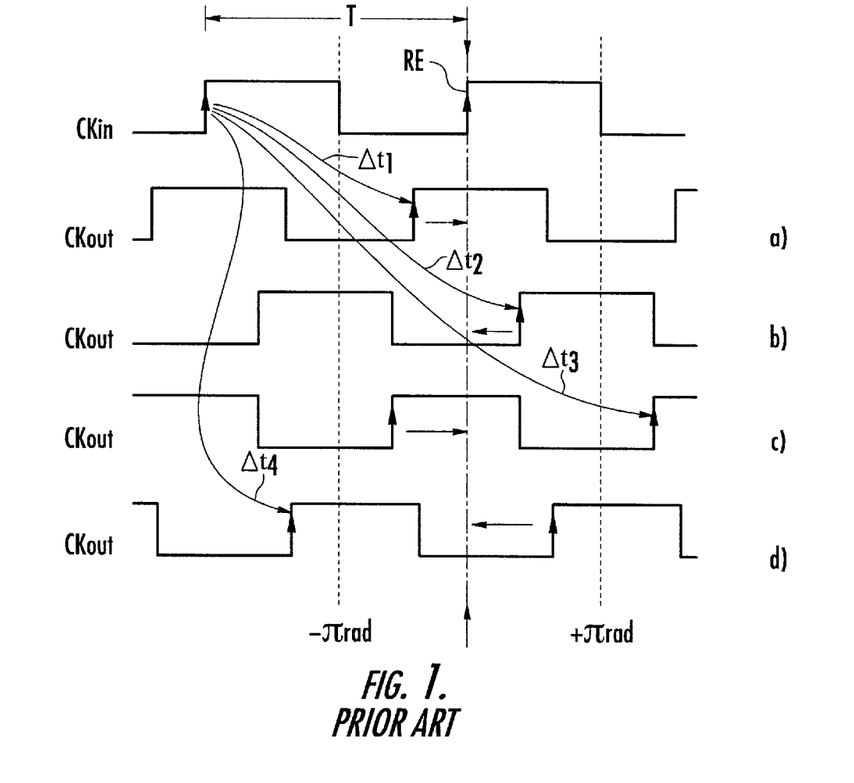
FIG. 1 is a time graph showing the operation of a conventional DLL circuit according to the prior art.

For a better understanding of the reason for the above statement, reference is made to FIG. 1 in which the periodic input signal is indicated as CKin and the output signal of the DLL, i.e., the output signal of the delay line, is indicated as Ckout. The output signal has a delay locked to the period of the input signal. The phase comparator operates on the leading edge RE of the input signal CKin and of the output signal CKout. In case a) of FIG. 1, the output signal CKout has a delay $\Delta t1$ relative to the input signal Ckin, where $t/2<\Delta t1<T$. The phase comparator detects the phase advance of the signal CKout relative to the signal CKin and communicates it to the control logic circuitry which modifies the delay $\Delta t$ of the delay line so as to increase the delay.

In case b), the output signal CKout has a delay $\Delta t2$ relative to the input signal Ckin, where $T<\Delta t2<(3/2)T$. The phase comparator detects the phase delay of the output signal CKout relative to the signal CKin and communicates it to the control logic circuitry which modifies the delay $\Delta t$ of the delay line so as to reduce the delay. In cases a) and b), the DLL can lock onto the period T of the input signal.

Case c) will now be examined. The output signal CKout has a delay $\Delta t3$ relative to the input signal Ckin, where $\Delta t3>(3/2)T$. In order for the DLL to be locked, the delay introduced by the delay line would have to be decreased. However, the phase comparator interprets this delay as an advance and informs the control logic circuitry of the need to increase the delay of the line. This is going in the opposite direction to that required to achieve locking.

Similarly, in case d) the output signal CKout has a delay $\Delta t4$ relative to the input signal Ckin, where $\Delta t4<T/2$. For the DLL to lock, it would therefore be necessary to increase the delay introduced by the line. However, the phase comparator interprets this advance as an excessive delay and informs the control logic circuitry to reduce the delay of the line. Again, this is going in the opposite direction to that required to achieve locking.

In the two cases c) and d), the delay locked loop does not tend towards the locking condition, but tends away from this condition. This occurs until, in case c), the maximum value of the delay which can be introduced by the line is reached and, in case d), the minimum value of the delay is reached. That is, until the delay locked loop reaches the limit of its own dynamic range, and the feedback loop can no longer operate.

SUMMARY OF THE INVENTION

In view of the prior art described above, an object of the present invention is to provide an improved DLL which is not affected by the disadvantages of conventional DLL circuits.

According to the present invention, this object is achieved by a delay-locked loop (DLL) circuit comprising a delay line with a delay which can be varied in a controlled manner to delay a periodic input signal of period T, and a control circuit for controlling the delay line to lock the delay to the period T.

The delay line supplies to the control circuit a plurality of delayed periodic signals. Each signal is preferably delayed relative to the periodic input signal by a respective fraction of the delay. The control circuit preferably comprise a sequence-detector circuit which can periodically detect, in the delayed periodic signals, characteristic sequences of digital values indicative of the delay. The control circuit can bring about a reduction or an increase in the delay for locking to the period T in dependence on the type of characteristic sequence.

BRIEF DESCRIPTION OF THE DRAWINGS

The characteristics and advantages of the present invention will become clearer from the following detailed description of a possible practical embodiment thereof, illustrated purely by way of a non-limiting example in the appended drawings, in which.

DETAILED DESCRIPTION OF THE PREFERRED EMBODIMENTS

Figure 2:
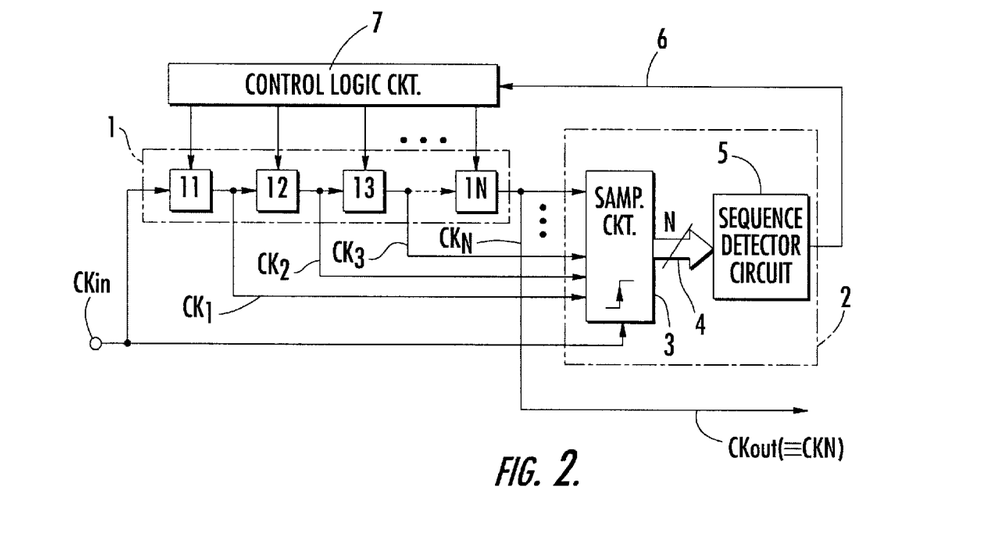
FIG. 2 is a schematic block diagram of a DLL circuit according to the present invention.

With reference to FIG. 2, a DLL circuit according to the present invention comprises a delay line 1 with a variable delay. The delay line comprises a chain of N substantially identical elemental delay units 11–1N. Each delay unit 11–1N introduces a delay equal to $\Delta t/N$, where $\Delta t$ is the total delay introduced by the delay line 1.

The delay line 1 receives as an input a periodic signal CKin of period T and outputs N delayed periodic signals CK1–CKN. Each of the delayed periodic signals CK1–CKN is taken at the output of a respective elemental delay unit 11–1N. The periodic signal CK1 is thus delayed by $\Delta t/N$ relative to the periodic input signal Ckin. Each of the periodic signals CKi, where i=2 . . . N, is delayed by $\Delta t/N$ relative to the preceding periodic signal CKi-1 and by $i(\Delta t/N)$ relative to the periodic input signal CKin.

The delayed periodic signals CK1–CKN and the periodic input signal CKin are supplied to a circuit 2 which can detect the magnitude of the delay $\Delta t$ introduced by the delay line 1 relative to the period T of the periodic input signal CKin. The circuit 2 comprises a sampling circuit 3 which operates in synch with the periodic input signal CKin, such as on the leading edge of the signal CKin. The sampling circuit 3 receives as inputs the N delayed periodic signals CK1–CKN. The sampling circuit 3 outputs a word 4 having N bits. Each bit corresponds to a respective signal of the N signals CK1–CKN. The word 4 forms an image or photograph of the levels of the signals CK1–CKN at the moment of sampling.

The N-bit word 4 is supplied to a sequence-interpreter or detector circuit 5, such as a decoder, for example, which interprets the N-bit word 4 and consequently activates a signal 6 responsive thereto. The signal 6 is supplied to control logic circuitry 7 of the DLL which controls the elemental delay units 11–1N of the delay line with variable delay 1 to increase or reduce the elemental delay $\Delta t/N$ introduced by each of them. This increases or reduces the total delay $\Delta t$ of the delay line 1.

According to the present invention, when there are changes in the elemental delay $\Delta t/N$, and hence in the total delay $\Delta t$ of the delay line 1, the levels of the delayed periodic signals CK1–CKN at a predetermined generic moment in time change. The logic states of the individual bits of the N-bit word 4 forms an image or photograph of the levels of the signals CK1–CKN taken at a preselected moment in time, and consequently change.

A certain value of the delay $\Delta t$ corresponds to each configuration of the N bits of the word 4, that is, to each sequence of 0s and 1s in the N-bit word 4. By interpreting the configuration of the N bits of the word 4, that is, by detecting the particular sequence of 0s and 1s, it is therefore possible to deduce the value of the delay $\Delta t$. It is also possible to determine whether the delay $\Delta t$ is greater than or less than the value T which corresponds to the locked condition of the loop. By repeating the operation periodically with a period of repetition equal to T, it is possible to keep the DLL loop in the locked condition.

The timing graphs shown in FIGS. 3 to 6 relate to the case of a delay line 1 comprising eight elemental delay units which supply eight delayed periodic signals CK1–CK8. The timing graphs will assist in providing an understanding of the foregoing explanation. An illustration of only eight delayed periodic signals is for purposes of simplifying the drawings. The present invention may clearly be extended to examples in which the delay lines supply a different number of periodic delayed signals, such as sixteen signals, for example.

Figure 3:
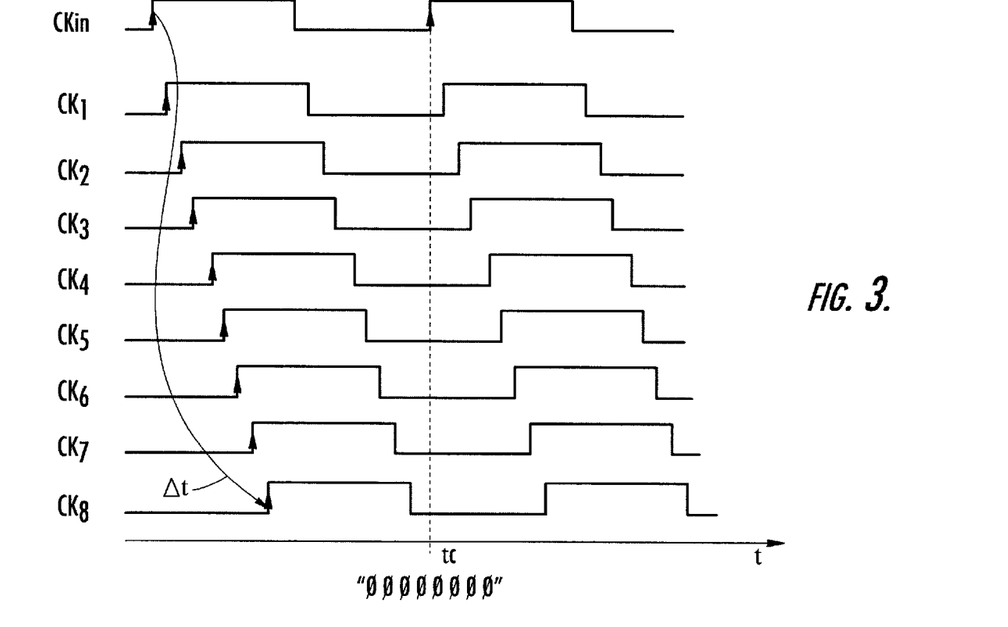
FIGS. 3 to 6 are timing graphs showing the operation of the DLL circuit according to the present invention.

FIG. 3 shows the case of a delay $\Delta t$ which is too small. In particular, the delay is less than $T/2$. At the moment tc at which the periodic signal CKin has a leading edge and the sampling of the signals CK1–CK8 therefore takes place, the configuration of the eight bits of the word 4 is as provided in Table 1 below.

TABLE 1

| bit 1 (CK1) | bit 2 (CK2) | bit 3 (CK3) | bit 4 (CK4) | bit 5 (CK5) | bit 6 (CK6) | bit 7 (CK7) | bit 8 (CK-8) |
|---|---|---|---|---|---|---|---|
| 0 | 0 | 0 | 0 | 0 | 0 | 0 | 0 |

If the word 4 is regarded as a sequence of eight bits, it will be noted that moving from bit 1 corresponding to the signal CK1 towards bit 8 corresponding to the signal CK8 in the sequence, there is no transition from 1 to 0 between one bit and the next bit. This configuration is interpreted by the circuit 5 as corresponding to a delay $\Delta t$ which is too small. The circuit 5 informs the control logic circuitry 7 by signal 6 of the need to increase the elemental delay $\Delta t/N$ of the delay units 1N–18.

Figure 4:
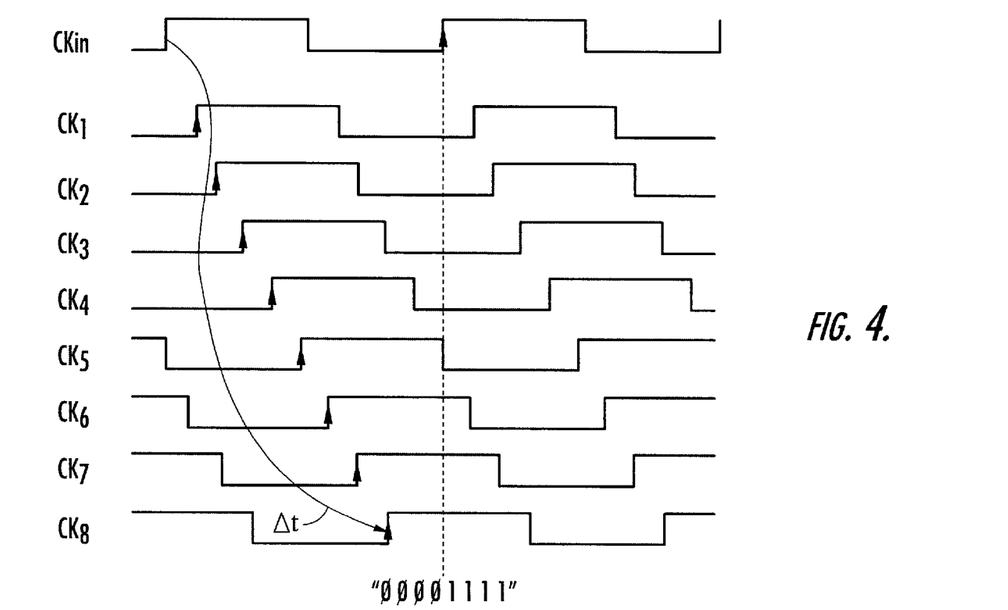

FIG. 4 shows the case of a delay $\Delta t$ which is still too small but is closer to the desired value T. In particular, the delay $\Delta t$ is between $T/2$ and T. At the moment in time tc, the configuration of the eight bits of the word 4 is provided in Table 2 below.

TABLE 2

| bit 1 (CK1) | bit 2 (CK2) | bit 3 (CK3) | bit 4 (CK4) | bit 5 (CK5) | bit 6 (CK6) | bit 7 (CK7) | bit 8 (CK-8) |
|---|---|---|---|---|---|---|---|
| 0 | 0 | 0 | 0 | 1 | 1 | 1 | 1 |

If the word 4 is regarded as a sequence of eight bits, it will be noted that moving from bit 1 corresponding to the signal CK1 towards bit 8 corresponding to the signal CK8 in the sequence, there is a 0 to 1 transition between bit 4 corresponding to the signal CK4 and bit 5 corresponding to the signal CK5. However, there is no 1 to 0 transition. This sequence is indicative of the fact that the delay $\Delta t$ is still too small but is tending towards the locked condition $\Delta t=T$. The circuit 5 informs the control logic circuitry 7 by signal 6 of the need to increase the elemental delay $\Delta t/N$ of the elemental delay units 11–18.

Figure 5:
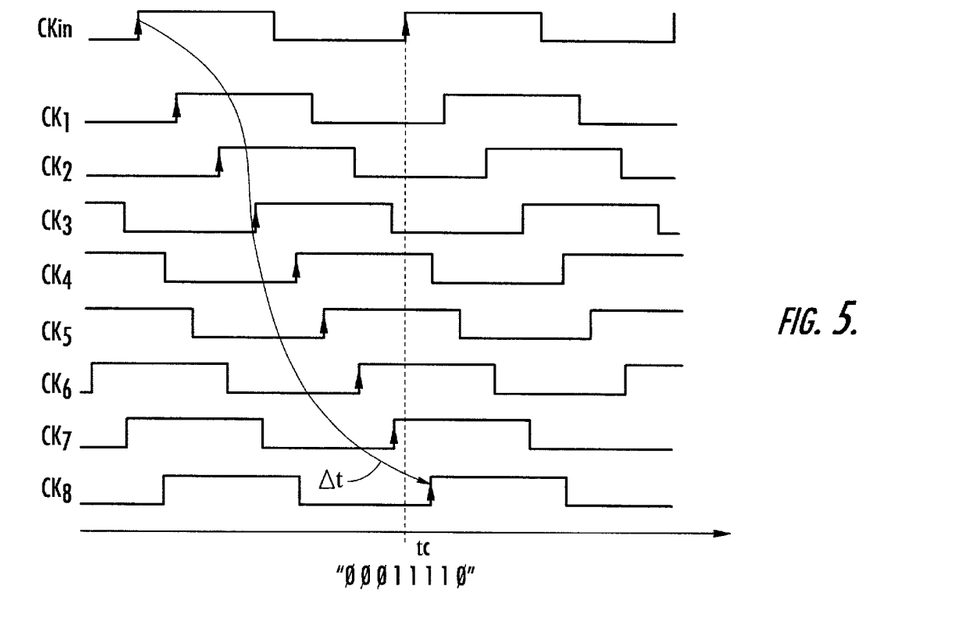

FIG. 5 shows the case of a delay $\Delta t$ which is slightly too great relative to the locking value. In particular, the delay $\Delta t$ is between T and $(3/2)T$. At the moment tc, the configuration of the eight bits of the word 4 is provided in Table 3 below.

TABLE 3

| bit 1 (CK1) | bit 2 (CK2) | bit 3 (CK3) | bit 4 (CK4) | bit 5 (CK5) | bit 6 (CK6) | bit 7 (CK7) | bit 8 (CK-8) |
|---|---|---|---|---|---|---|---|
| 0 | 0 | 0 | 1 | 1 | 1 | 1 | 0 |

If the word 4 is regarded as a sequence of eight bits, it will be noted that moving from bit 1 corresponding to the signal CK1 towards bit 8 corresponding to the signal CK8 in the sequence, there is a 1 to 0 transition. In particular, this transition is between bit 7 corresponding to the signal CK7 and bit 8 corresponding to the signal CK8. This sequence is indicative of the fact that the delay $\Delta t$ is too great, but is tending towards the locked situation $\Delta t=T$. The circuit 5 informs the control logic circuitry 7 by the signal 6 of the need to reduce the elemental delay $\Delta t/N$ of the elemental delay units 11–18.

Figure 6:
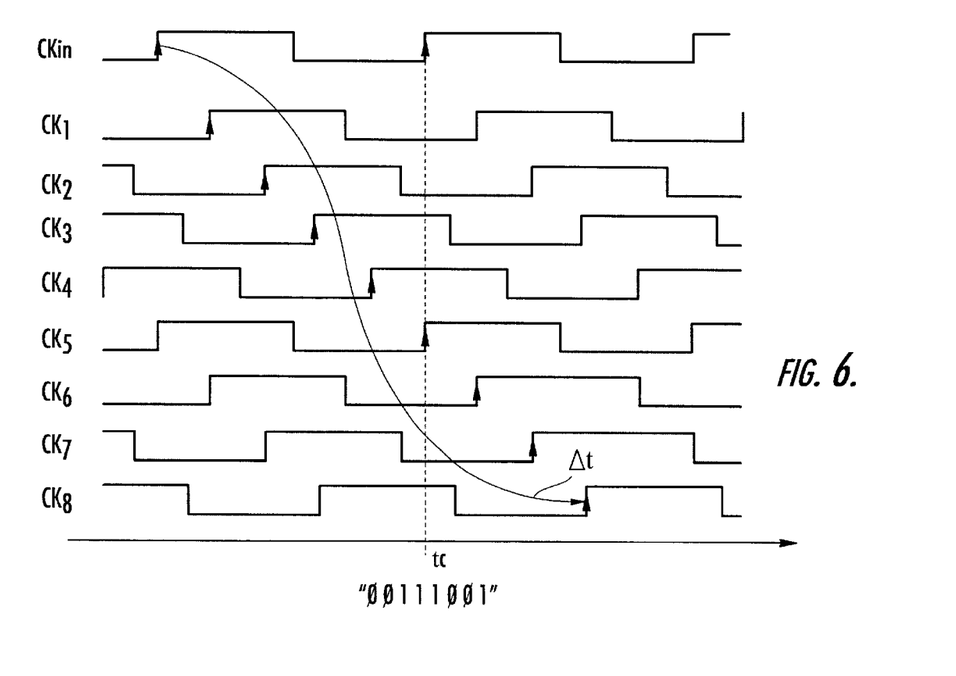

FIG. 6 shows the case of a very long delay $\Delta t$. In particular, the delay $\Delta t$ is greater than $(3/2)T$. At the moment tc, the configuration of the eight bits of the word 4 is provided in Table 4 below.

TABLE 4

| bit 1 (CK1) | bit 2 (CK2) | bit 3 (CK3) | bit 4 (CK4) | bit 5 (CK5) | bit 6 (CK6) | bit 7 (CK7) | bit 8 (CK8) |
|---|---|---|---|---|---|---|---|
| 0 | 0 | 1 | 1 | 1 | 0 | 0 | 1 |

Once again, if the word 4 is regarded as a sequence of eight bits, it will be noted that moving from bit 1 corresponding to the signal CK1 towards bit 8 corresponding to the signal CK8 in this sequence, there is an alternation of 0s and 1s, and hence several 1 to 0 transitions between consecutive pairs of bits. This situation is indicative of the fact that the delay $\Delta t$ is very great. The circuit 5 informs the control logic circuitry 7 by the signal 6 of the need to reduce the elemental delay $\Delta t/N$ of the elemental delay units 11–18.

Thus, according to the type of sequence of logic values present in the N-bit word 4 and, in particular, according to whether or not there are one or more 1 to 0 transitions in the sequence, moving from the bit corresponding to the signal CK1 towards the bit corresponding to the signal CKN the circuit 5 can establish the magnitude of the delay $\Delta t$ correctly. The circuits can also communicate to the control logic circuitry 7 the type of correction to be performed.

A first type of sequence comprising all of 0s means that the delay of the line 1 is very short and should be increased. A second type of sequence, composed of 0s followed by 1s (no 1 to 0 transition) means that the delay of the line is still too small but is approaching the locking value T. A third type of sequence composed of 0s followed by 1s followed by 0s means that the delay of the line is too great but is approaching the locked value T. A fourth type of sequence, composed of 0s alternating with is means that the delay of the line is very large and should be reduced. This is true in general, irrespective of the number of delayed periodic signals CK1–CKN, and irrespective of the number of elemental delay units 11–1N. Hence this is not only true for the example of eight signals described above, but also for a larger number of signals, such as sixteen signals, for example.

Figure 7:
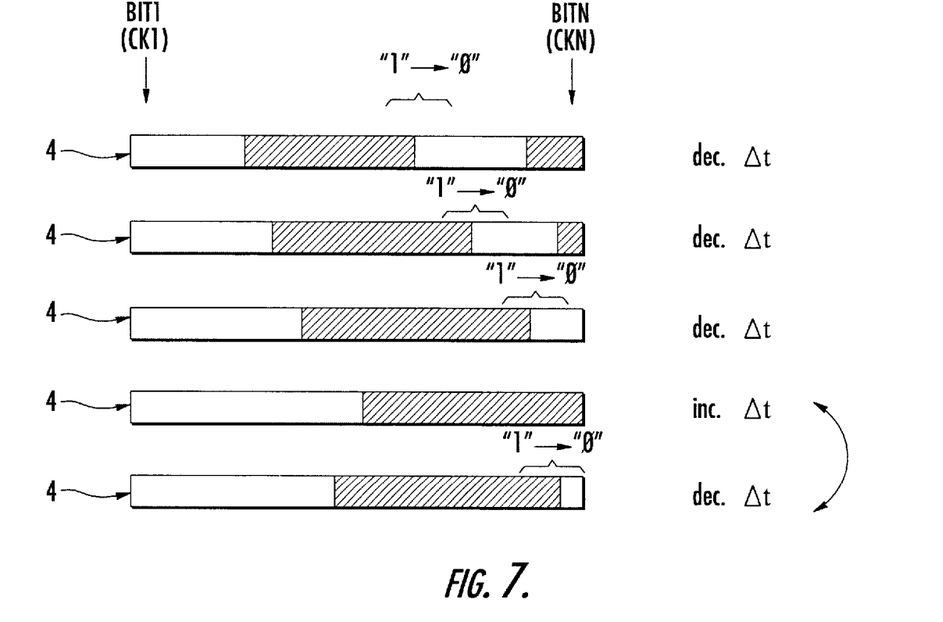
FIGS. 7 and 8 are schematic views of characteristic sequences of digital values which can be detected by the DLL circuit according to the present invention for locking the loop.
Figure 8:
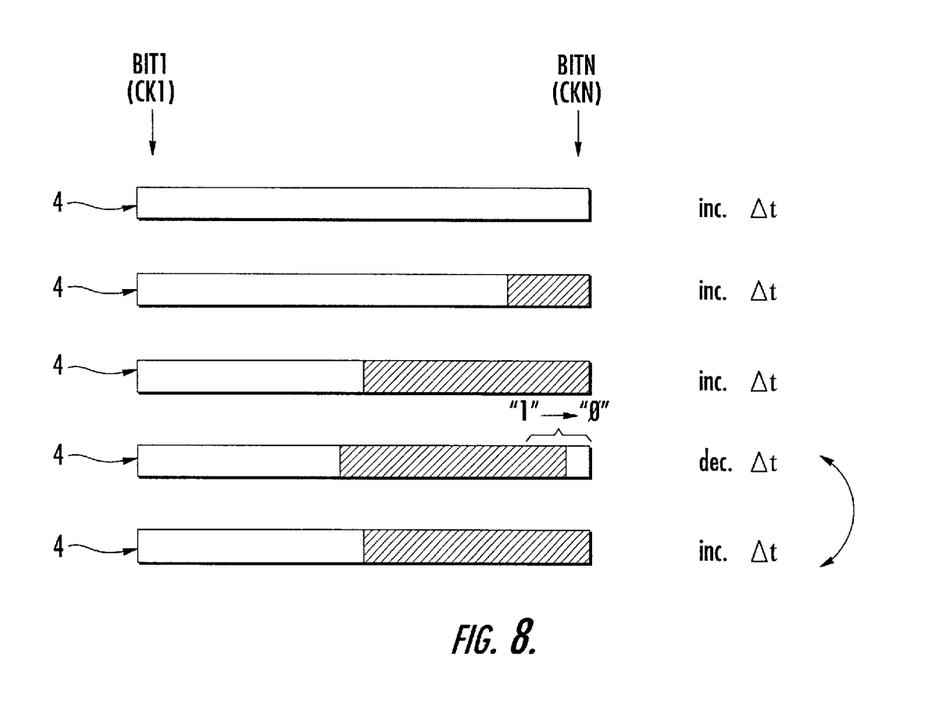

FIGS. 7 and 8 show schematically the variation of the sequences of logic values within the word 4 in the generic case of a delay line with N elemental delay units in order to reach the locked condition. The sequence starts from a condition of a very large delay of the line (FIG. 7) or a very slight delay (FIG. 8). In both figures, the hatched areas within the words 4 represent logic 1s and the blank areas represent logic 0s.

With reference to FIG. 7, it will be noted that as long as within the word 4 there is a 1 to 0 transition between the i-th bit and the (i+1)-th bit, the delay $\Delta t$ of the delay line is decreased. Over time the 1 to 0 transition moves towards the bit N corresponding to the signal CKN until it disappears. A situation of dynamic equilibrium is reached in which bit N continues to change from 1 to 0 at successive sampling moments.

With reference to FIG. 8, as long as the word 4 does not show a 1 to 0 transition between two consecutive bits, the delay $\Delta t$ of the delay line is increased. As the delay $\Delta t$ increases, the last bits of the word 4 (bit N and the immediately preceding bits) change state to a 1. In this case also a situation of dynamic equilibrium in which bit N continues to change from 1 to 0 at successive sampling moments is reached.

It is interesting to observe the similarity between the sampling circuit 3 and the sequence-detector circuit 5 and a "bucket brigade" circuit. It will be noted that, by virtue of the present invention, the information concerning the correction which the control logic circuitry of the delay line should make is always correct, even for delays $\Delta t$ less than $T/2$ or greater than $(3/2)T$.

Figure 9:
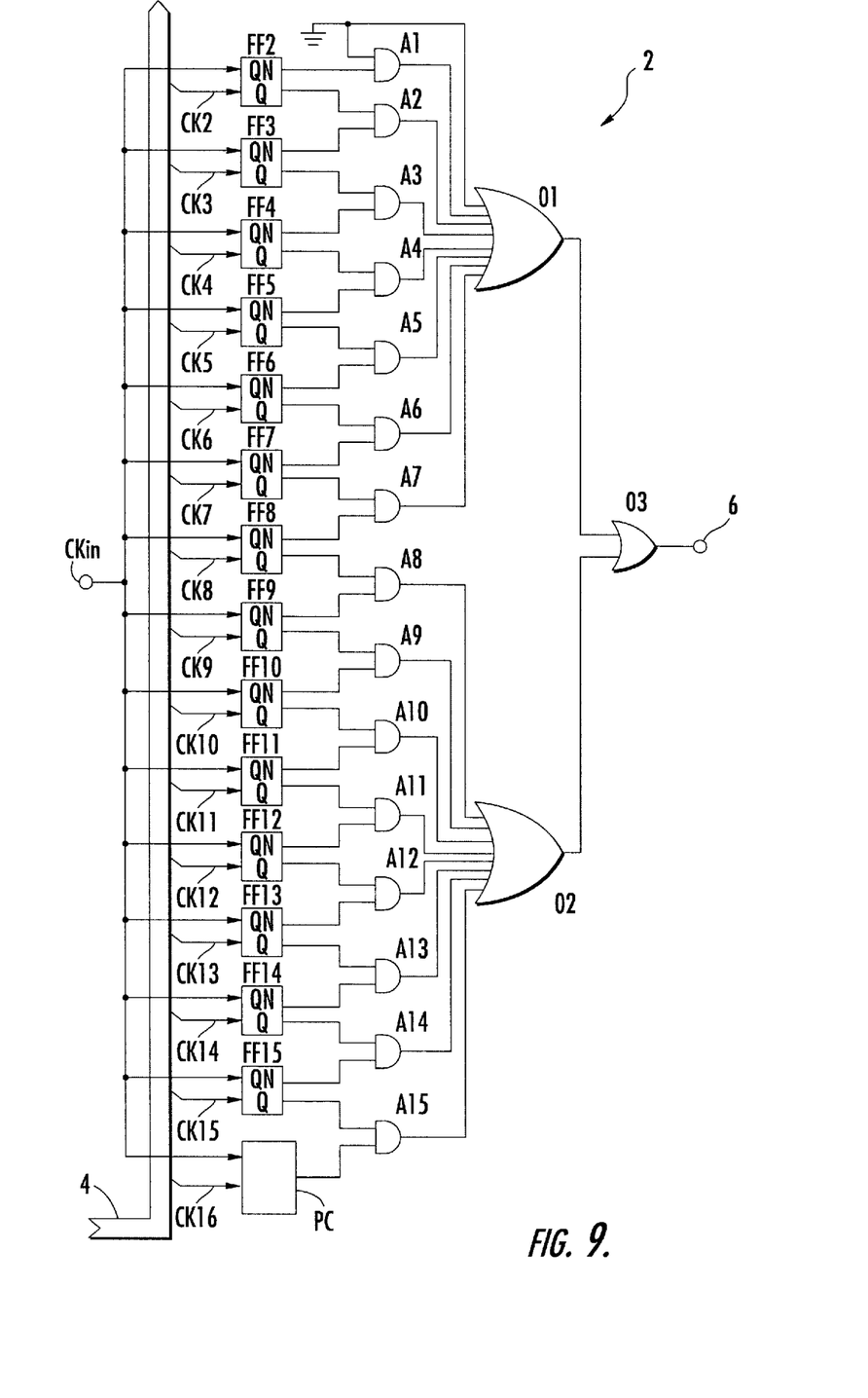
FIG. 9 is a detailed circuit diagram of a functional block illustrated in FIG. 2.

FIG. 9 shows the circuit diagram of a possible practical embodiment of the circuit 5 of FIG. 2 in an example of a delay line with sixteen elemental delay units which therefore supplies sixteen delayed periodic signals CK1–CK16.

The circuit comprises fourteen D-type flip-flops FF2–FF15, each of which receives at a data input a respective delayed periodic signal CK2–CK15. The clock inputs of all of the flip-flops FF2–FF15 receive the periodic input signal CKin. Each flip-flop FF2–FF15 has two outputs Q and QN. The output Q adopts the state present in the respective data input signal at the moment when the signal CKin has a leading edge. The output QN adopts the complementary state.

The output Q of each of the flip-flops FF2–FF14 is supplied, together with the complementary output QN of the following flip-flop FF3–FF15, to a respective AND gate A2–A14 with two inputs. The complementary output QN of the flip-flop FF2 is supplied to an AND gate A1 with two inputs, the other input of which is connected to ground. The output Q of the flip-flop FF15 is supplied to an input of an AND gate A15 with two inputs. The other input of which is supplied by the output of a phase comparator PC. For example, a NAND gate or another known type phase comparator which receives the periodic signals CKin and CK16 as inputs.

The outputs of the AND gates A1–A7 are supplied to seven inputs of an OR gate 01 with eight inputs. The eighth input of the OR gate 01 is connected to ground. The outputs of the AND gates A8–A15 are supplied to the eight inputs of an OR gate 02 with eight inputs. The outputs of the OR gates 01 and 02 are supplied to the two inputs of an OR gate 03 with two inputs. The output forms the signal 6 for the control logic circuitry 7 (FIG. 2).

The flip-flips FF2–FF15 sample the delayed periodic signals CK2–CK15 upon each leading edge of the periodic signal CKin. The AND gates A1–A15 detect the presence of 1 to 0 transitions between consecutive bits within the word 4 moving from the bit corresponding to the signal CK1 to the bit corresponding to the signal CK16. The presence of one or more 1 to 0 transitions within the word 4 means that one or more inputs of the OR gates 01, 02 has been brought to a level 1 and the output 6 of the gate 03 has consequently been brought to a 1.

This level informs the control logic circuitry 7 of the need to reduce the value of the delay $\Delta t$. If there is no 1 to 0 transition between consecutive bits in the word 4, the output 6 remains at a 0. This level informs the control logic circuitry 7 of the need to increase the delay value $\Delta t$.

It will be noted that the fact that no flip-flop is provided for sampling the signal CK1, and that an input of the AND gate A1 and an input of the OR gate 01 are connected to ground prevents the occurrence of errors due to sampling of the signal CK1 with a lesser delay relative to the input signal CKin. In all cases, the first bit in the word 4 corresponding precisely to the signal CK1 is always equal to 0. To have the first bit of the word 4 equal to 1 would assume that the elemental delay $\Delta t/N$ were greater than $T/2$. In other words, the total delay $\Delta t$ introduced by the line would be greater than $N(T/2)$. For example, the total delay $\Delta t$ is greater than 4T with eight elemental delay units or is greater than 8T with sixteen units. In practice, such delay values are never reached.

It can be noted that for sequences of the first and fourth types, the information supplied by the phase comparator PC is inhibited since this information is combined in an AND gate with the output Q of the flip-flop FF15 which is at 0. This is because the sequences of the first and fourth types correspond to very short and very long delays $\Delta t$, respectively, for which, as described with reference to FIG. 1, the phase comparator PC supplies incorrect information on the type of correction to be performed on the delay $\Delta t$. The information supplied by the phase comparator PC is enabled, however, for sequences of the second and third types in which the output Q of the flip-flop FF15 is a 1, which correspond to values of $\Delta t$ close to the locking value T.

Clearly, variations and/or additions may be applied to the embodiment described and illustrated above. For example, the provision of a circuit for sampling the delayed periodic signals is not strictly essential since it suffices, more generally, to provide a circuit which can interpret the sequences of 0s and 1s which are present periodically in an N-bit word. Each bit corresponds to a respective signal of the N signals CK1–CKN, for example, such as to the leading or trailing edges of the periodic signal input to the DLL circuit.

It is also clear that the particular circuit embodiment shown in FIG. 7 is purely an example and is not to be limiting. Moreover, the N delayed periodic signals supplied by the delay line are not necessarily delayed equally and may, more generally, be periodic signals each delayed by a fraction of the total delay $\Delta t$ relative to the periodic input signal. In this case, the sequences of 0s and is in the N-bit word would clearly be different. It would nevertheless still be possible to establish a relationship between the current value of the delay $\Delta t$ and the current sequence.

If a fast speed is required because the circuit 2 has to be able to operate more quickly than the minimum delay $\Delta t$ which can be introduced by the delay line 1, it may be necessary to use structures with analog reading amplifiers, i.e., sense amplifiers, instead of the flip-flops FF2–FF15.

That which is claimed is:

1. A delay-locked loop (DLL) circuit comprising:
    a delay line having a delay that can be varied for delaying a periodic input signal having a period T, said delay line providing a plurality of delayed periodic signals each delayed relative to the periodic input signal by a respective fraction of the delay; and
    a control circuit connected to said delay line for locking the delay to the period T, said control circuit comprising a sequence-detector circuit for detecting in the plurality of delayed periodic signals sequences of digital values indicative of the delay and for varying the delay based upon the type of sequences detected so that the delay is locked to the period T;
    said sequence-detector circuit detecting transitions from a first logic level to a second logic level between consecutive bits of a word in which each bit corresponds to a respective delayed periodic signal, the word being reflective of the digital values of the plurality of delayed periodic signals when sample.

2. A DDL circuit according to claim 1, wherein said sequence-detector circuit receives the periodic input signal for detecting the sequences in synch with the periodic input signal.

3. A DDL circuit according to claim 1, wherein said delay line comprises a plurality of elemental delay units in cascade, each elemental delay unit introducing a respective elemental delay which can be varied by said control circuit.

4. A DDL circuit according to claim 3, wherein the elemental delays are equal to one another, and wherein the plurality of delayed periodic signals are equally delayed.

5. A DDL circuit according to claim 1, wherein said control circuit further comprises a sampling circuit for sampling the plurality of delayed periodic signals in synch with the periodic input signal.

6. A DDL circuit according to claim 5, wherein said sampling circuit comprises at least one flip-flop having a synchronization input receiving the periodic input signal.

7. A DDL circuit according to claim 1, wherein said sequence-detector circuit comprises:
    a phase comparator for comparing a phase between the periodic input signal and one of the plurality of delayed periodic signals having a delay equal to the delay; and
    an inhibit circuit for inhibiting a result of the phase comparison from said phase comparator in presence of the sequences indicative of values of the delay outside a predetermined range of values.

8. A delay-locked loop (DLL) circuit comprising:
    a delay line having a delay that can be varied for delaying a periodic input signal having a period T, said delay line providing a plurality of delayed periodic signals each delayed relative to the periodic input signal by a respective fraction of the delay; and
    a control circuit connected to said delay line for locking the delay to the period T, said control circuit comprising
        a sampling circuit for sampling the plurality of delayed periodic signals in synch with the periodic input signal, and
        a sequence-detector circuit connected to said sampling circuit for detecting in the plurality of delayed periodic signals sequences of digital values indicative of the delay for varying the delay based upon the type of sequences detected for locking the delay to the period T.

9. A DDL circuit according to claim 8, wherein said sequence-detector circuit receives the periodic input signal for detecting the sequences in synch with the periodic input signal.

10. A DDL circuit according to claim 8, wherein said delay line comprises a plurality of elemental delay units in cascade, each elemental delay unit introducing a respective elemental delay which can be varied by said control circuit.

11. A DDL circuit according to claim 10, wherein the elemental delays are equal to one another, and wherein the plurality of delayed periodic signals are equally delayed.

12. A DDL circuit according to claim 8, wherein said sampling circuit comprises at least one flip-flop having a synchronization input receiving the periodic input signal.

13. A DDL circuit according to claim 8, wherein said sequence-detector circuit detects transitions from a first logic level to a second logic level between consecutive bits of a word in which each bit corresponds to a respective delayed periodic signal, the word being reflective of the digital values of the plurality of delayed periodic signals when sampled.

14. A DDL circuit according to claim 8, wherein said sequence-detector circuit comprises:

a phase comparator for comparing a phase between the periodic input signal and one of the plurality of delayed periodic signals having a delay equal to the delay; and an inhibit circuit for inhibiting a result of the phase comparison from said phase comparator in presence of the sequences indicative of values of the delay outside a predetermined range of values.

15. A delay-locked loop (DLL) circuit comprising:

a delay line for delaying an input signal having a period T, said delay line providing a plurality of delayed signals; and a control circuit connected to said delay line for locking a delay of said delay line to the period T by detecting in the plurality of delayed signals sequences of digital values indicative of the delay for varying the delay based upon the type of sequences detected;

said control circuit comprising a sequence-detector circuit for receiving the input signal for detecting the sequences in synch with the input signal by detecting transitions from a first logic level to a second logic level between consecutive bits of a word in which each bit corresponds to a respective delayed signal, the word being reflective of the digital values of the plurality of delayed signals when sampled.

16. A DDL circuit according to claim 15, wherein said control circuit comprises a sampling circuit for sampling the plurality of delayed signals in synch with the input signal.

17. A DDL circuit according to claim 15, wherein said sampling circuit comprises at least one flip-flop having a synchronization input receiving the input signal.

18. A DDL circuit according to claim 15, wherein said delay line comprises a plurality of elemental delay units in cascade, each elemental delay unit introducing a respective elemental delay which can be varied by said control circuit.

19. A DDL circuit according to claim 18, wherein the elemental delays are equal to one another, and wherein the plurality of delayed signals are equally delayed.

20. A DDL circuit according to claim 15, wherein each delayed signal is delayed relative to the input signal by a respective fraction of the delay.

21. A DDL circuit according to claim 15, wherein said sequence-detector circuit comprises:

a phase comparator for comparing a phase between the input signal and one of the plurality of delayed signals having a delay equal to the delay; and an inhibit circuit for inhibiting a result of the phase comparison from said phase comparator in presence of the sequences indicative of values of the delay outside a predetermined range of values.

22. A method for maintaining a locked condition in a delay-locked loop (DLL) circuit comprising a delay line having a variable delay and being supplied by a periodic input signal, the method comprising:

generating a plurality of delayed periodic signals based upon the periodic input signal, each delayed periodic signal being delayed relative to the periodic input signal by a respective fraction of the delay;

periodically detecting sequences of digital values in the plurality of delayed periodic signals;

detecting transitions from a first logic level to a second logic level between consecutive bits of a word in which each bit corresponds to a respective delayed periodic signal, the word being reflective of the digital values of the plurality of delayed periodic signals when sampled; and varying the delay based upon the detected sequences of digital values.

23. A method according to claim 22, wherein the delay line comprises a plurality of elemental delay units in cascade; and wherein the method further comprises introducing a respective elemental delay.

24. A method according to claim 23, wherein the elemental delays introduced by the plurality of elemental delay units are equal to one another, with the delayed periodic signals being delayed equally.

25. A method according to claim 22, further comprising sampling the plurality of delayed periodic signals in synch with the periodic input signal.

26. A DDL circuit according to claim 22, further comprising:

comparing a phase between the periodic input signal and the delayed periodic signal that is delayed by the delay; and inhibiting a result of the phase comparison in presence of the sequences indicative of values of the delay outside a predetermined range of values.

* * * * *